US006794279B1

(12) United States Patent
Stephen et al.

(10) Patent No.: US 6,794,279 B1
(45) Date of Patent: Sep. 21, 2004

(54) PASSIVATING INORGANIC BOTTOM ANTI-REFLECTIVE COATING (BARC) USING RAPID THERMAL ANNEAL (RTA) WITH OXIDIZING GAS

(75) Inventors: Alan D. Stephen, Austin, TX (US); Michael E. Exterkamp, Pflugerville, TX (US); Jonathan Doan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/577,706

(22) Filed: May 23, 2000

(51) Int. Cl.[7] .......................................... H01L 21/3205
(52) U.S. Cl. ...................................................... 438/585
(58) Field of Search ........................................ 438/585

(56) References Cited

U.S. PATENT DOCUMENTS 6,214,683 B1 * 4/2001 Xiang et al. ................ 438/305
6,287,918 B1 * 9/2001 Xiang et al. ................ 438/265

OTHER PUBLICATIONS

Fukushima et al., "Analysis of Substrate Effect in Chemically Amplified Resist," *Journal of Photopolymer Science & Technology*, vol. 10, No. 3, pp. 457–464 (1997).
Sturtevant et al., "Substrate Contamination Effects in the Processing of Chemically Amplified DUV Photoresists," *SPIE*, vol. 2197, pp. 770–780 (Jan., 1994).
Dean et al., "Investigation of Deep Ultraviolet Photoresists on TiN substrates," *SPIE*, vol. 2438, pp. 514–528 (Jun., 1995).

* cited by examiner

*Primary Examiner*—Carl Whitehead
*Assistant Examiner*—Jack Chen
(74) *Attorney, Agent, or Firm*—Williams, Morgan & Amerson

(57) ABSTRACT

A method is provided, the method including forming a gate dielectric layer above a substrate layer and forming a gate conductor layer above the gate dielectric layer. The method also includes forming an inorganic bottom anti-reflective coating layer above the gate conductor layer and treating the inorganic bottom anti-reflective coating layer with an oxidizing treatment during a rapid thermal anneal process.

10 Claims, 11 Drawing Sheets

PASSIVATING INORGANIC BOTTOM ANTI-REFLECTIVE COATING (BARC) USING RAPID THERMAL ANNEAL (RTA) WITH OXIDIZING GAS

BACKGROUND OF THE INVENTION

1. Field of the Invention

This invention relates generally to semiconductor fabrication technology, and, more particularly, to techniques for manufacturing semiconductor devices with reduced critical dimensions.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. All other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires being able to form and pattern components such as the gate conductor and gate dielectric on such reduced scales, consistently, robustly and reproducibly, preferably in a self-aligned manner. The ability to form and pattern components such as the gate conductor and gate dielectric on such reduced scales, consistently, robustly and reproducibly, is limited by, among other things, physical limits imposed by photolithography. Diffraction effects impose limits on the critical dimensions of components such as gate conductors and gate dielectrics that correspond roughly to the wavelengths of the light used to perform the photolithography. Consequently, one conventional approach to achieving reduced critical dimensions involves retooling wafer fabs to use shorter wavelengths, as in deep ultraviolet (DUV) photolithography and/or in high-energy electron beam lithography.

However, residual nitrides at the surface of an inorganic bottom anti-reflective coating (BARC) typically used in deep ultraviolet (DUV) photolithography may cause "footing" or neutralization of the Photo Acid Generator (PAG) in deep ultraviolet (DUV) photoresists at the interface between the inorganic bottom anti-reflective coating (BARC) and an overlying deep ultraviolet (DUV) photoresist layer. Footing may lead to deep ultraviolet (DUV) photolithography reworks, increasing manufacturing costs and decreasing throughput.

One conventional approach to passivating residual nitrides at the surface of inorganic bottom anti-reflective coatings (BARCs) typically used in deep ultraviolet (DUV) photolithography involves flowing oxygen (O2) during the last stages of the deposition of the inorganic bottom anti-reflective coatings (BARCs). However, this approach is often not effective at passivating the residual nitrides at the surface of the inorganic bottom anti-reflective coatings (BARCs).

Another conventional approach to passivating residual nitrides at the surface of inorganic bottom anti-reflective coatings (BARCs) typically used in deep ultraviolet (DUV) photolithography involves running the wafers through an oxygen plasma strip process after the deposition of the inorganic bottom anti-reflective coatings (BARCs). However, this approach is often not stable, and, therefore is also often not effective at passivating the residual nitrides at the surface of the inorganic bottom anti-reflective coatings (BARCs).

The present invention is directed to overcoming, or at least reducing the effects of, one or more of the problems set forth above.

SUMMARY OF THE INVENTION

In one aspect of the present invention, a method is provided, the method including forming a gate dielectric layer above a substrate layer and forming a gate conductor layer above the gate dielectric layer. The method also includes forming an inorganic bottom anti-reflective coating layer above the gate conductor layer and treating the inorganic bottom anti-reflective coating layer with an oxidizing treatment during a rapid thermal anneal process.

In another aspect of the present invention, a semiconductor device is provided, formed by a method including forming a gate dielectric layer above a substrate layer and forming a gate conductor layer above the gate dielectric layer. The method also includes forming an inorganic bottom anti-reflective coating layer above the gate conductor layer and treating the inorganic bottom anti-reflective coating layer with an oxidizing treatment during a rapid thermal anneal process.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
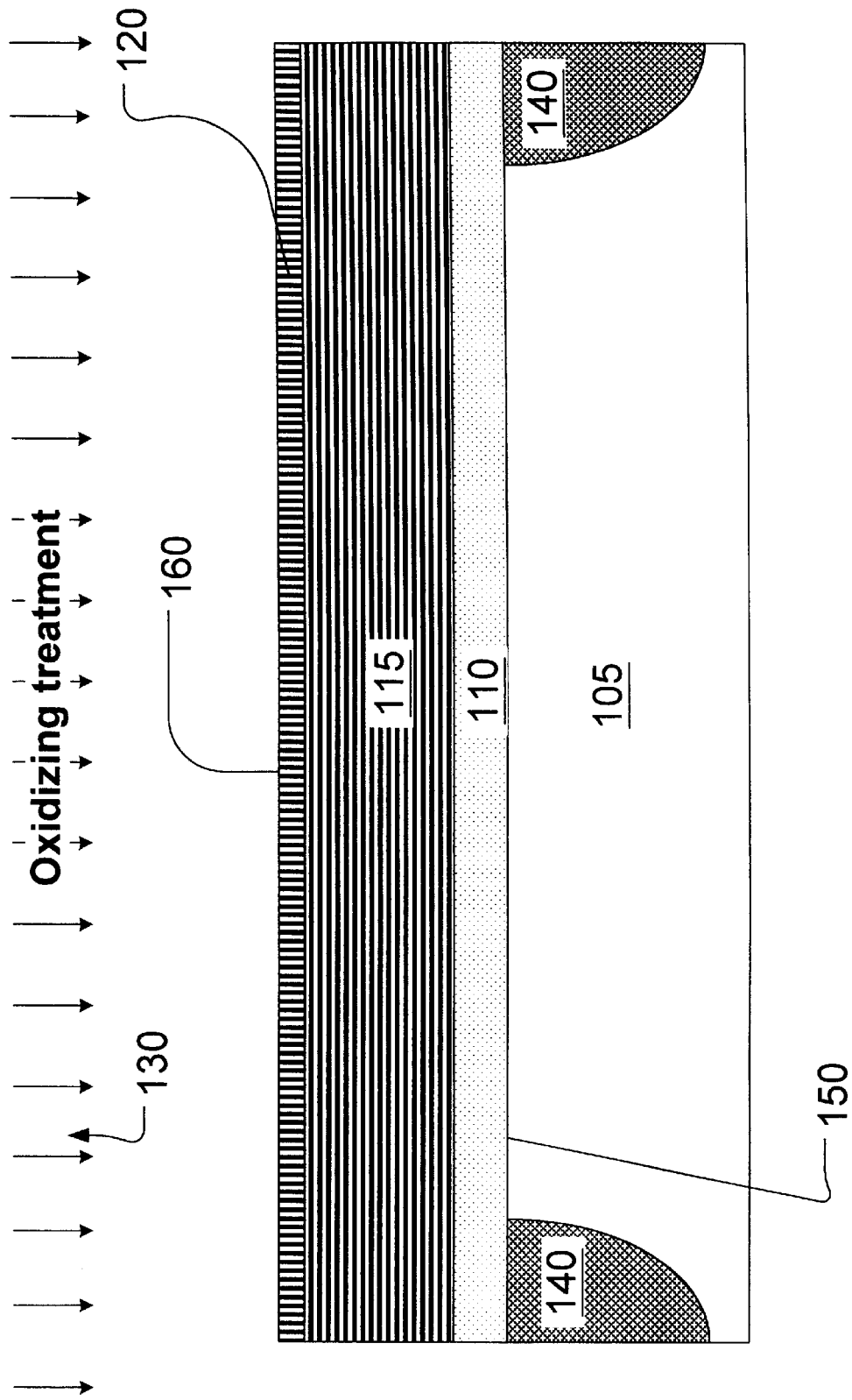
FIGS. 1–11 illustrate schematically in cross-section various embodiments of a method for semiconductor device fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–11. Although the various regions and structures of a semiconductor device are depicted in the drawings as having very precise, sharp configurations and profiles, those skilled in the art recognize that in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

FIGS. 1–11 illustrate a method of forming an MOS transistor 1100 (FIG. 11) according to the present invention. As shown in FIG. 1, a dielectric layer 110 may be formed above an upper surface 150 of a semiconducting substrate 105, such as doped-silicon. The dielectric layer 110 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 110 may have a thickness above the upper surface 150 ranging up to approximately 50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 110 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 110 may have an equivalent oxide thickness $t_{ox-eq}$ ranging up to approximately 50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}/4$, approximately. For example, the dielectric layer 110 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{ox-eq}/K_{ox}=24t_{ox-eq}/4$, approximately, an equivalent oxide thickness $t_{ox-eq}$ ranging up to approximately 50 Å would correspond to a $Ta_2O_5$ thickness $t_{TaO}$ ranging up to approximately 300 Å.

As shown in FIG. 1, a conductive layer 115 may be formed above the dielectric layer 110. The conductive layer 115 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 500–5000 Å. The conductive layer 115 may be formed of a variety of metals such as aluminum (Al), titanium (Ti), zirconium (Zr), tungsten (W), tantalum (Ta), nickel (Ni), molybdenum (Mo), cobalt (Co), and the like.

In various alternative illustrative embodiments, the conductive layer 115 may be a doped-poly conductive layer 115. The doped-poly conductive layer 115 may be formed by a variety of known techniques for forming such layers, e.g., CVD, LPCVD, PECVD, PVD, and the like, and may have a thickness ranging from approximately 500–5000 Å. In one illustrative embodiment, the doped-poly conductive layer 115 has a thickness of approximately 2000 Å and is formed by an LPCVD process for higher throughput.

The doped-poly conductive layer 115 may be doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000–2000 Å, for example. The doping of the poly may conveniently be accomplished by diffusing or implanting the dopant atoms and/or molecules through the upper surface of the poly. The doped-poly conductive layer 115 may then be subjected to a heat-treating process that may be a rapid thermal anneal (RTA) process performed at a temperature ranging from approximately 800–1100° C. for a time ranging from approximately 5–60 seconds.

As shown in FIG. 1, an inorganic bottom antireflective coating (BARC) layer 120, such as SiON or $SiO_xN_y$, may be used in deep ultraviolet (DUV) photolithography, and may be formed above the conductive layer 115. As shown in FIG. 1, an upper surface 160 of the inorganic bottom antireflective coating (BARC) layer 120 may be treated with an oxidizing treatment (indicated by the arrows 130) while being subjected to a rapid thermal anneal (RTA) process performed at a temperature ranging from approximately 800–1100° C. for a time ranging from approximately 5–60 seconds.

In various illustrative embodiments, the oxidizing treatment may include flowing an oxidizing gas, such as oxygen ($O_2$), during the rapid thermal anneal (RTA) process. It is believed that the oxidizing treatment neutralizes and/or passivates and/or passifies residual, free nitrogen ($N_2$) and residual nitrides, by forming nitrogen-containing compounds. These nitrogen-containing compounds, formed by the oxidizing treatment, are believed to be more stable than the residual, free nitrogen ($N_2$) and residual nitrides remaining on the upper surface 160 of the inorganic bottom antireflective coating (BARC) layer 120 after formation of the inorganic bottom antireflective coating (BARC) layer 120. These nitrogen-containing compounds, formed by the oxidizing treatment, are also believed not to cause "footing" or neutralization of the Photo Acid Generator (PAG) in deep ultraviolet (DUV) photoresists at the interface between the inorganic bottom anti-reflective coating (BARC) layer 120 and an overlying deep ultraviolet (DUV) photoresist layer, such as deep ultraviolet (DUV) photoresist layer 230 (described more fully below with reference to FIG. 2).

As shown in FIG. 1, shallow trench isolation (STI) regions 140 formed of suitable dielectric materials may be provided to isolate the MOS transistor 1100 (FIG. 11) electrically from neighboring semiconductor devices such as other MOS transistors (not shown). The shallow trench isolation (STI) regions 140 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The shallow trench isolation (STI) regions 140 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3$/$SrTiO_3$), and the like. Alternatively, the shallow trench isolation (STI) regions 140 may also be formed of any suitable "low dielectric constant" or "low K" dielectric material, where K is less than or equal to about 4.

Figure 2:
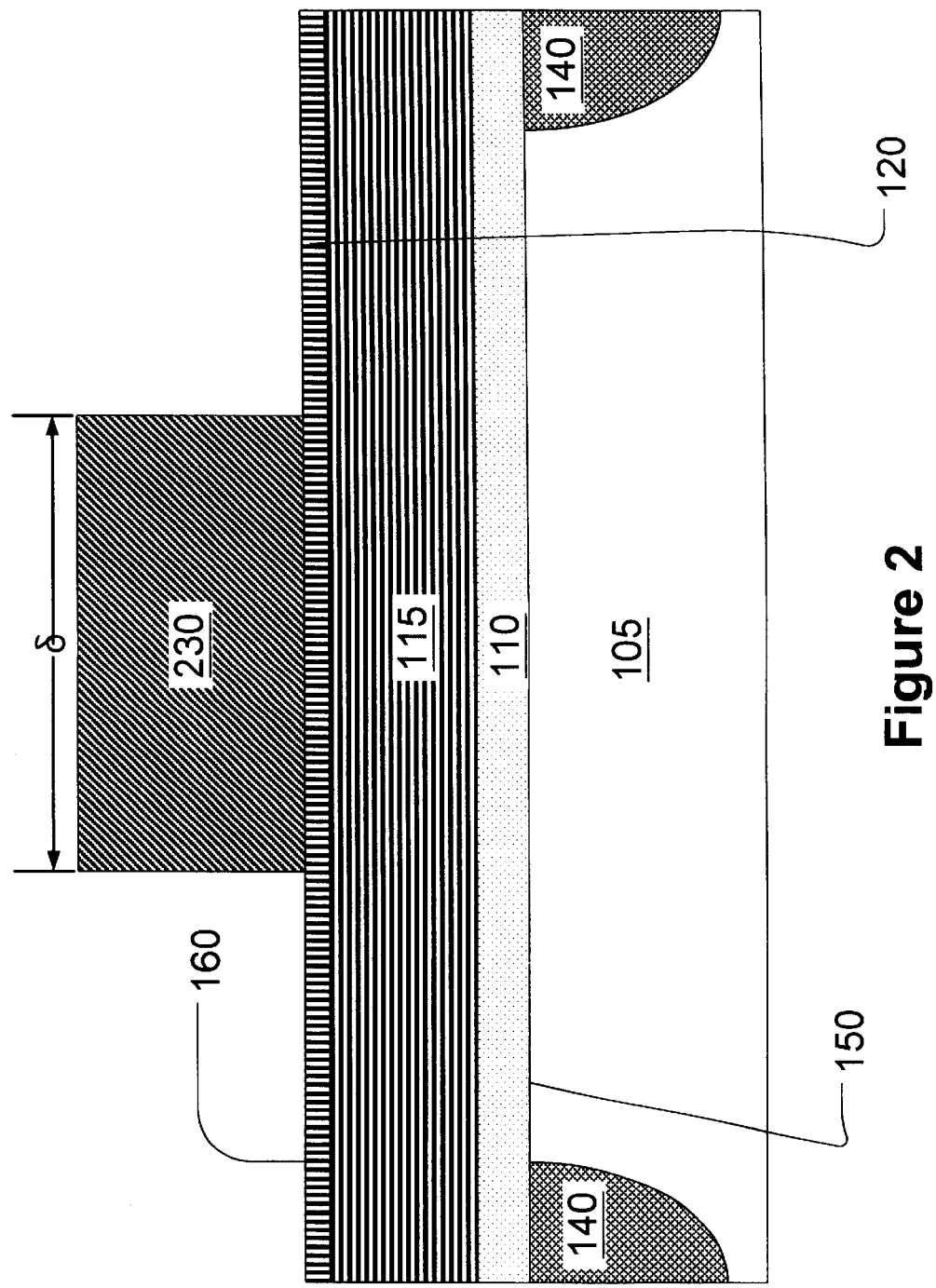

As shown in FIG. 2, a patterned deep ultraviolet (DUV) photoresist mask 230 may be formed above the upper surface 160 of the inorganic bottom antireflective coating (BARC) layer 120. The patterned deep ultraviolet (DUV) photoresist mask 230 may be patterned using deep ultraviolet (DUV) photolithography. Examples include Shipley's Apex®, UVS®, and the like. As shown in FIG. 2, the patterned deep ultraviolet (DUV) photoresist mask 230 may have a smallest, diffraction-limited dimension δ that may be in a range of about 1800–2000 Å.

Figure 3:
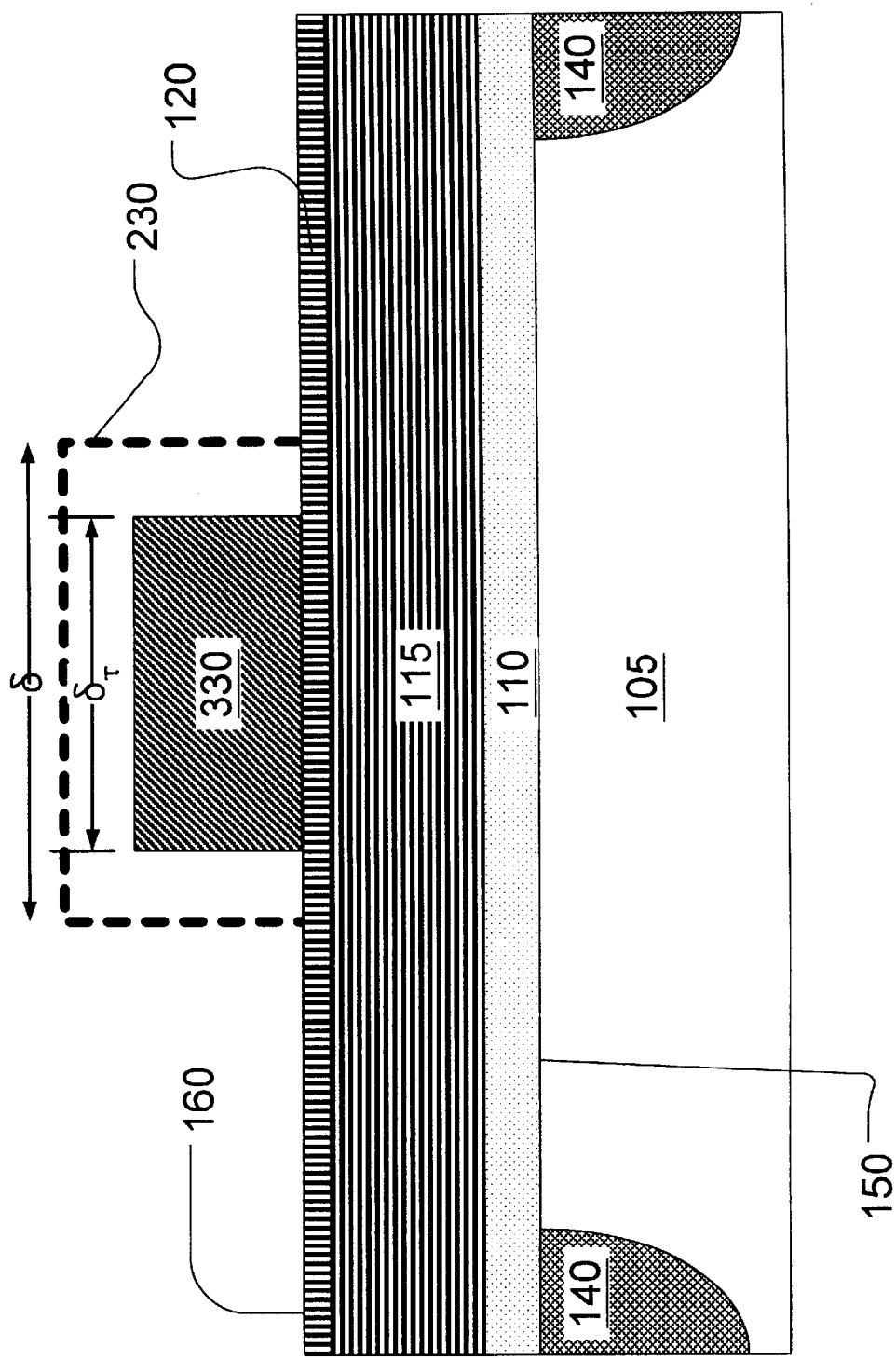

As shown in FIG. 3, the patterned deep ultraviolet (DUV) photoresist mask 230 (indicated in phantom) may optionally be trimed using a controlled deep ultraviolet (DUV) photoresist trim to form a trimmed deep ultraviolet (DUV) photoresist mask 330. The patterned deep ultraviolet (DUV) photoresist mask 230 may optionally be trimmed using a dry etch plasma process, for example. The trimmed deep ultraviolet (DUV) photoresist mask 330 will typically have the critical dimension $δ_τ$ that may be in a range of about 700–1500 Å that will determine the size of a gate conductor 415 and a gate dielectric 410, as shown in FIG. 4.

Figure 4:
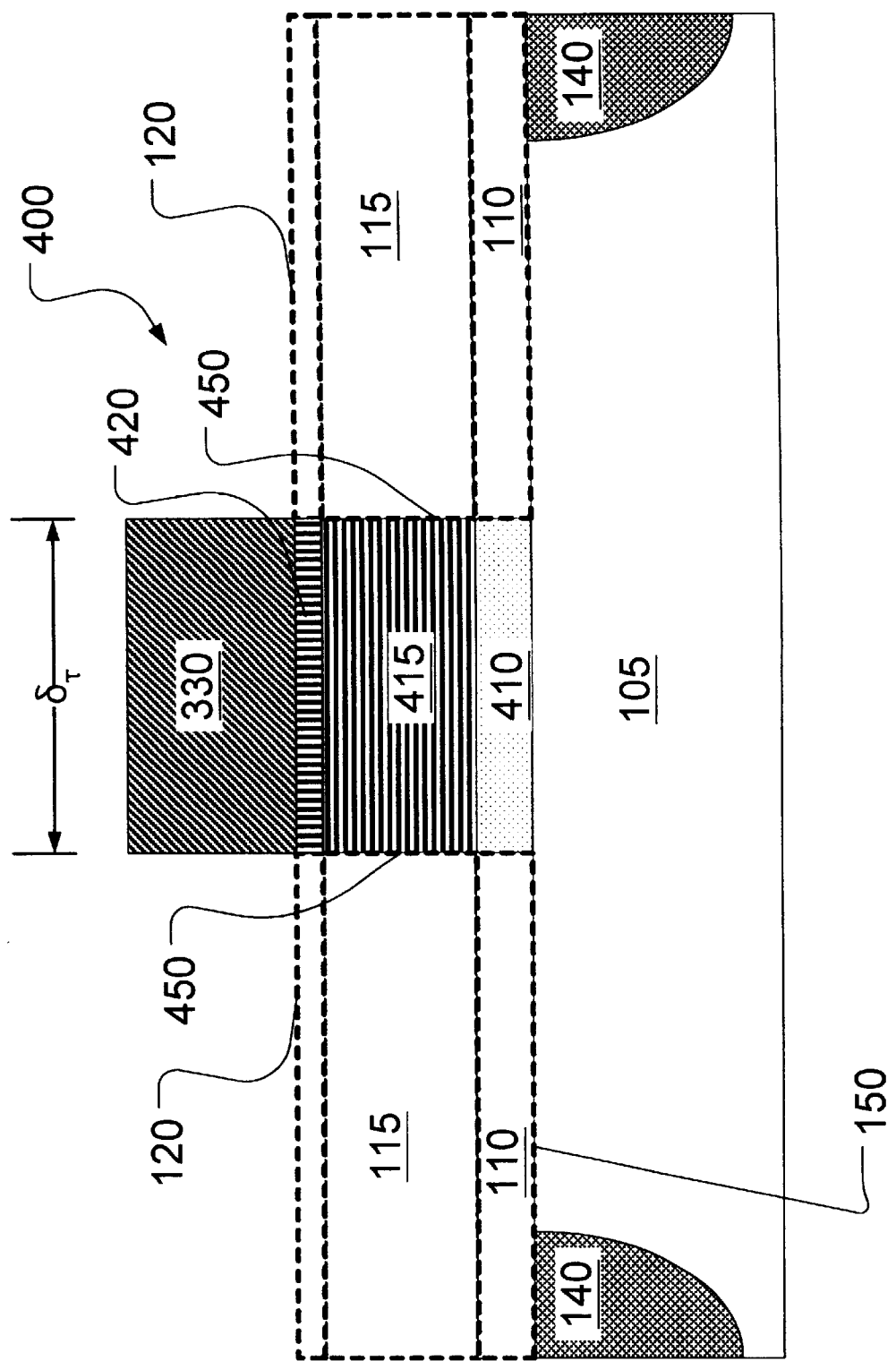
Figure 5:
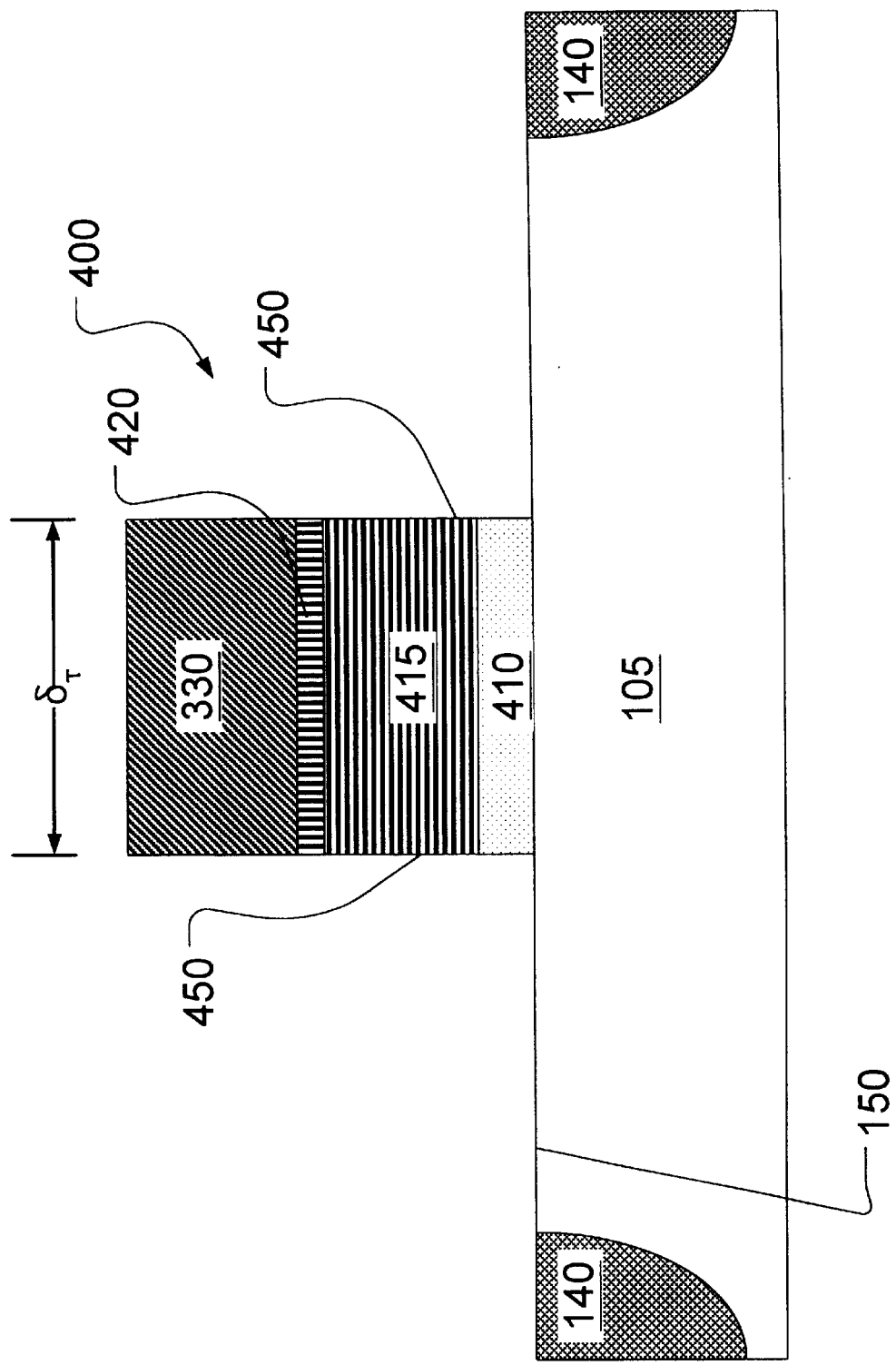

As shown in FIGS. 4–5, the trimmed deep ultraviolet (DUV) photoresist mask 330 having the critical dimension $δ_τ$ is then used as a mask to form a masked gate stack 400, having edges 450. The masked gate stack 400 may include the trimmed deep ultraviolet (DUV) photoresist mask 330, a remnant 420 of the inorganic bottom antireflective coating (BARC) layer 120, the gate conductor 415, and the gate dielectric 410. The masked gate stack 400 may be formed by removing portions of the dielectric layer 110, the conductive layer 115 and the inorganic bottom antireflective coating (BARC) layer 120 (shown in phantom) not protected by the trimmed deep ultraviolet (DUV) photoresist mask 330, using an anisotropic etching process, for example. The masked gate stack 400 will have the critical dimension $δ_τ$ defined by the trimmed deep ultraviolet (DUV) photoresist mask 330.

As shown in FIGS. 4–5, the masked gate stack 400 may be formed using a variety of known etching techniques, such as an anisotropic etching process. A selective anisotropic etching technique may be used, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments.

Figure 6:
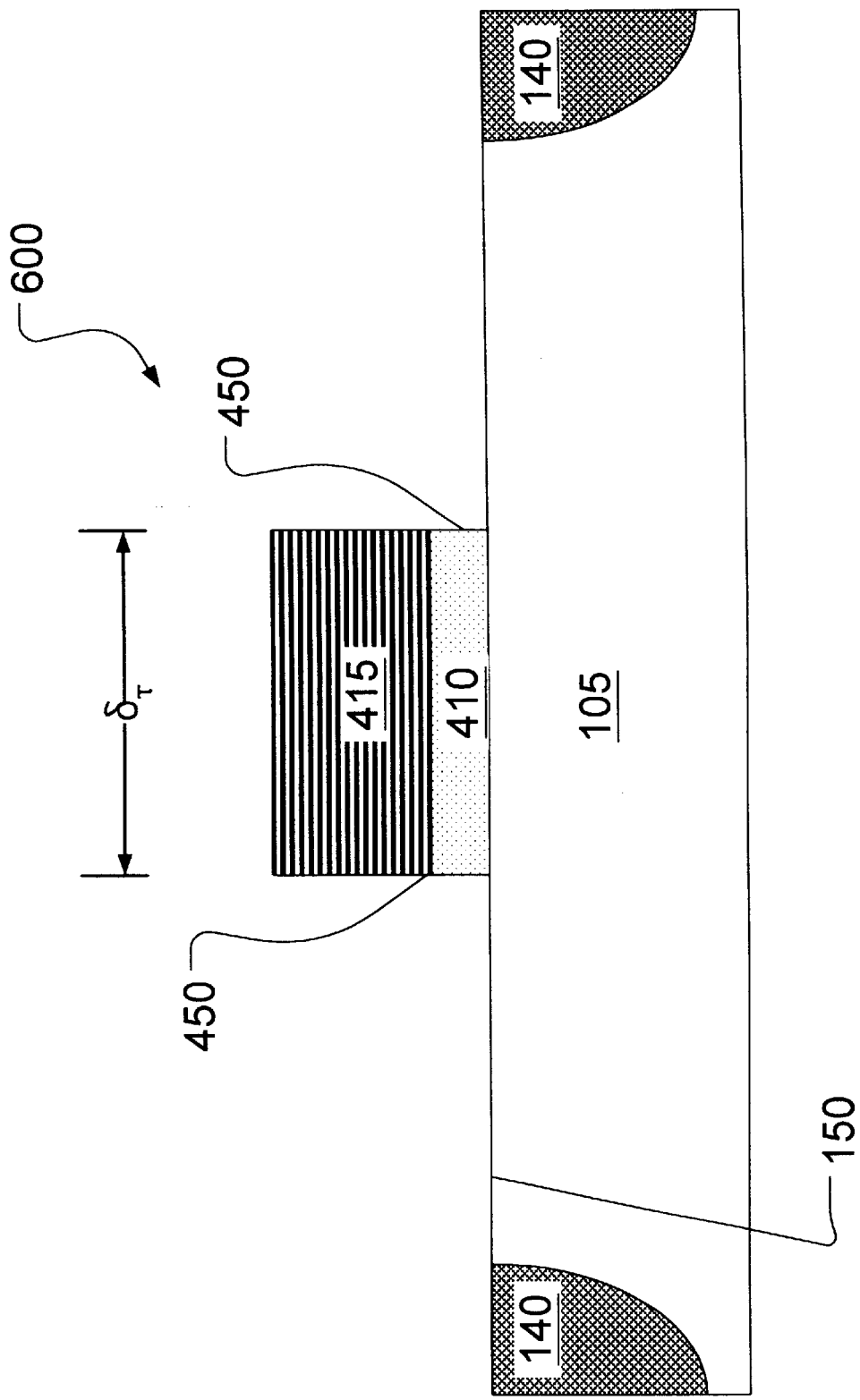

As shown in FIG. 6, the trimmed deep ultraviolet (DUV) photoresist mask 330 having the critical dimension $δ_τ$ (FIGS. 3–5) and the remnant 420 of the inorganic bottom antireflective coating (BARC) layer 120, may be removed. The trimmed deep ultraviolet (DUV) photoresist mask 330 may be removed by being stripped away, by ashing, for example. Alternatively, the trimmed deep ultraviolet (DUV) photoresist mask 330, and the remnant 420 of the inorganic bottom antireflective coating (BARC) layer 120, may be stripped using hot phosphoric acid ($H_3PO_4$), for example. The stripping away of the trimmed deep ultraviolet (DUV) photoresist mask 330, and the remnant 420 of the inorganic bottom antireflective coating (BARC) layer 120, forms an unmasked gate stack 600, having the edges 450. The unmasked gate stack 600 may include the gate conductor 415 and the gate dielectric 410.

Figure 7:
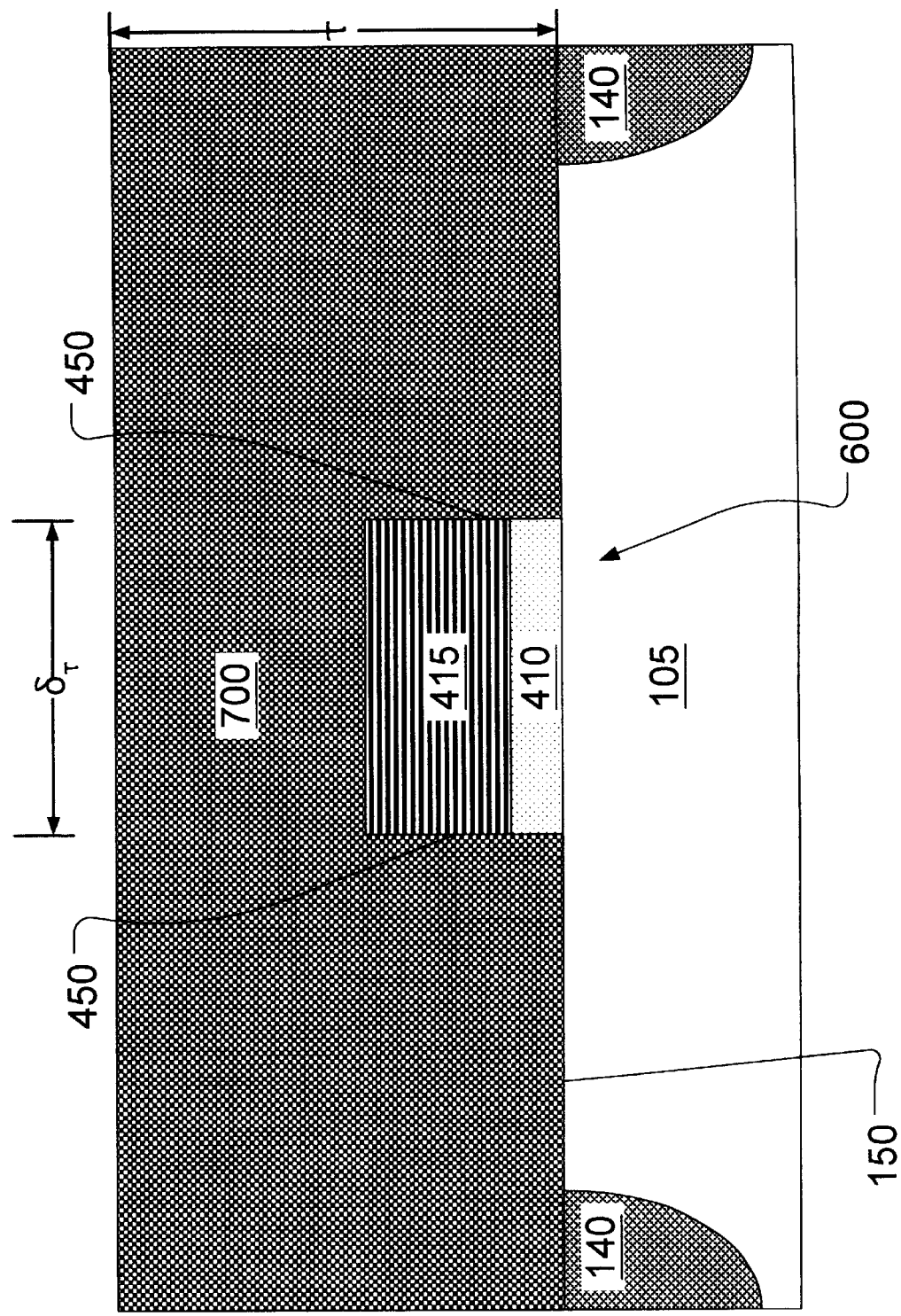

As shown in FIG. 7, a masking layer 700, formed of photoresist, for example, may be formed above the upper surface 150 of the semiconducting substrate 105, and above and adjacent the unmasked gate stack 600. The masking layer 700 may have a thickness τ above the upper surface 150 ranging from approximately 500–5000 Å, for example. In various illustrative embodiments, the thickness τ above the upper surface 150 is about 5000 Å. In various alternative illustrative embodiments, the thickness τ above the upper surface 150 ranges from approximately 500–1000 Å.

Figure 8:
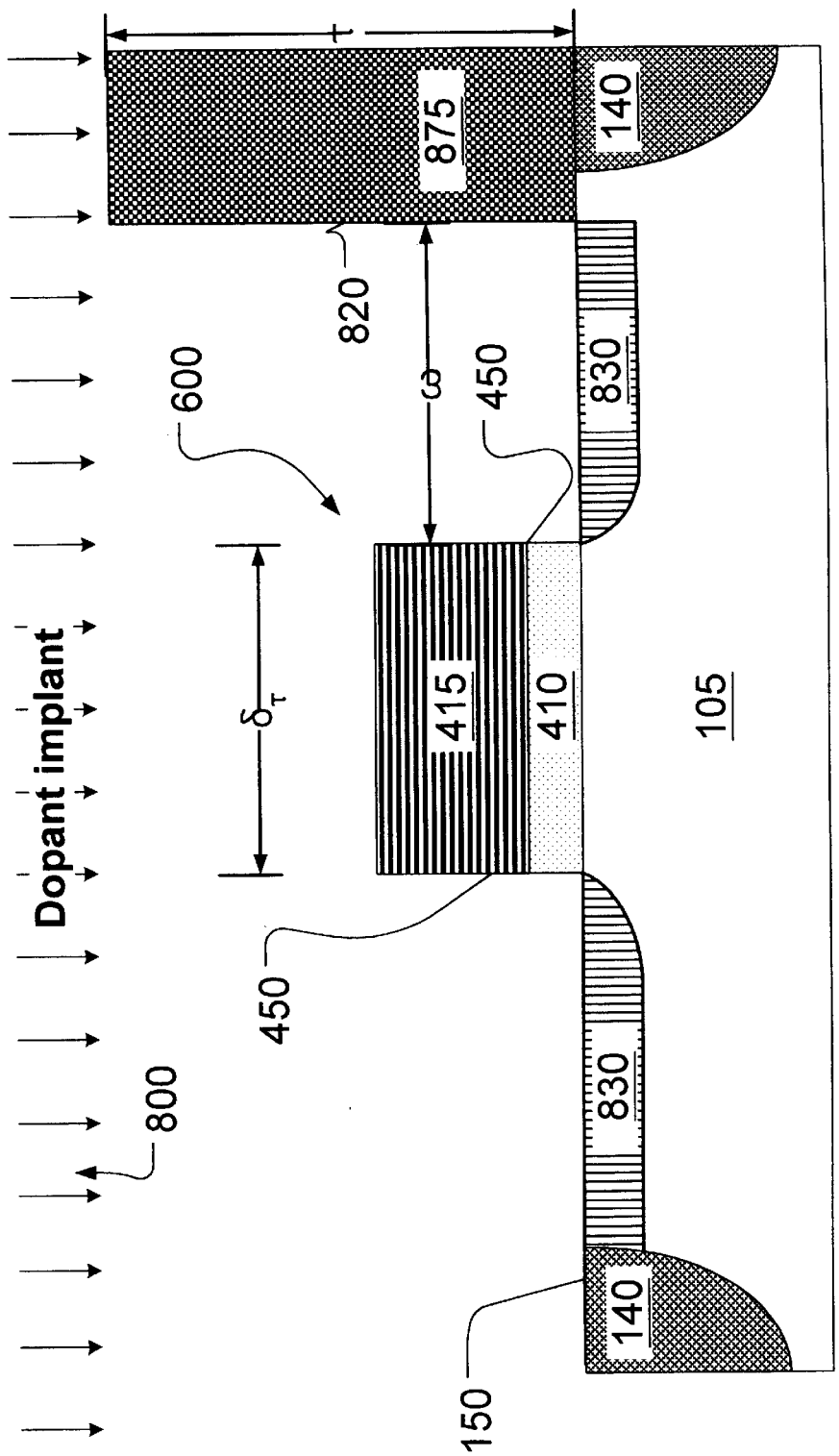

As shown in FIG. 8, the masking layer 700 may be patterned to form the mask 875 above at least a portion of the shallow trench isolation (STI) 140. The masking layer 700 may be patterned to form the mask 875 using a variety of known photolithography and/or etching techniques. The mask 875 may have an edge 820 spaced apart from the edge 450 of the unmasked gate stack 600 by a distance ω ranging from approximately 1000–1500 Å, for example.

The mask 875 may be formed over the STI region 140, as in conventional CMOS fabrication methods, to protect the PMOS (NMOS) transistor regions while the NMOS (PMOS) transistor regions are being implanted to form $N^-$-doped ($P^-$-doped) regions 830, for example. As shown in FIG. 8, a dopant 800 (indicated by the arrows) may be implanted to introduce dopant atoms and/or molecules into the semiconducting substrate 105 to form the $N^-$-doped ($P^-$-doped) regions 830. After activation, the $N^-$-doped ($P^-$-doped) regions 830 become the $N^-$-doped ($P^-$-doped) source/drain extension (SDE) regions 930 (as described more fully belong with reference to FIG. 9).

Figure 11:
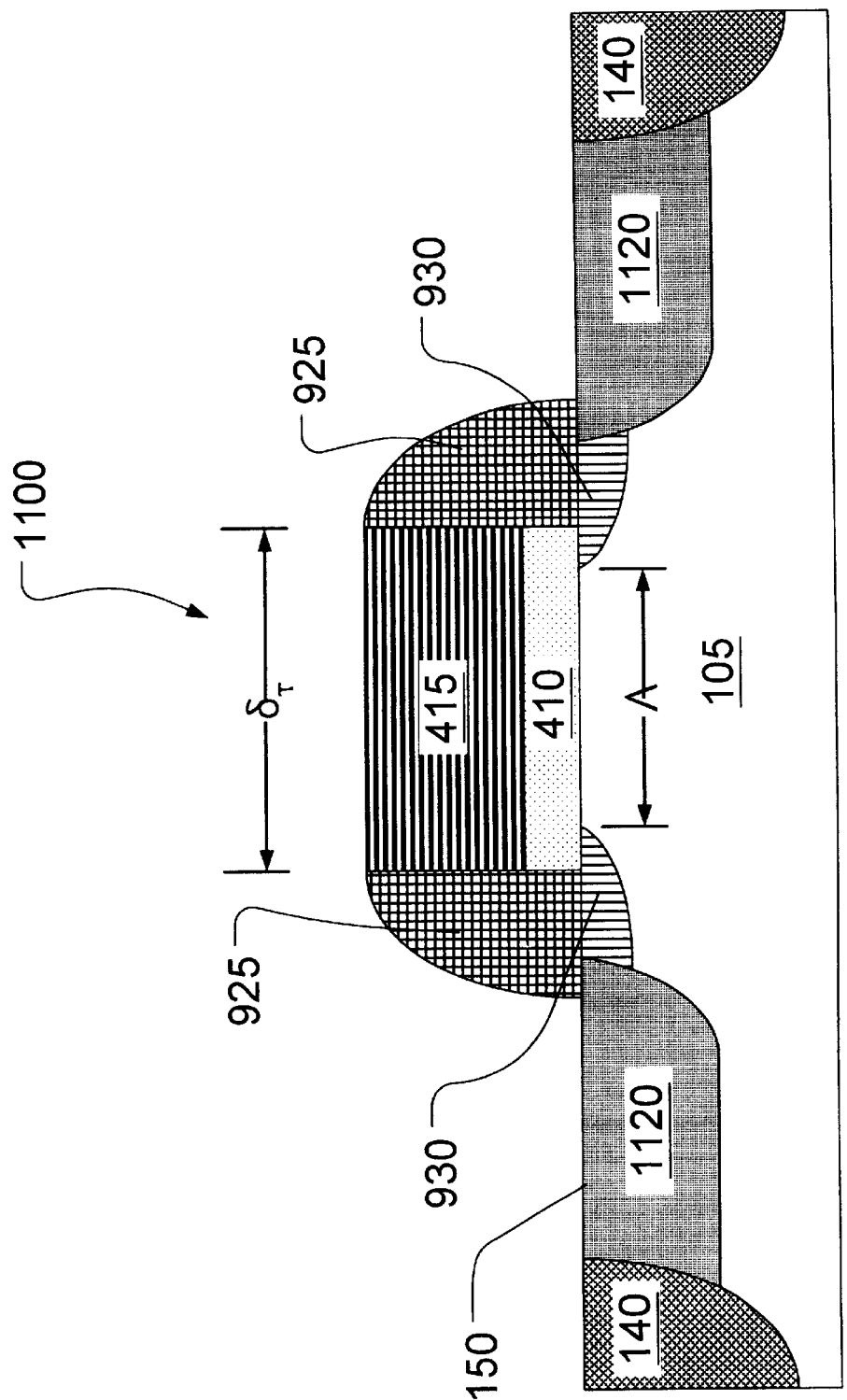

In various illustrative embodiments, the $N^-$-doped ($P^-$-doped) regions 830 may be formed by being implanted with a source/drain extension (SDE) dose of As (for $N^-$-doping appropriate for an NMOS transistor 1100, FIG. 11) or $BF_2$ (for $P^-$-doping appropriate for a PMOS transistor 1100, FIG. 11). The source/drain extension (SDE) dose may range from about $1.0 \times 10^{14}$–$1.0 \times 10^{15}$ ions/$cm^2$ at an implant energy ranging from about 3–50 keV. The $N^-$-doped ($P^-$-doped) regions 830 may be subjected to a rapid thermal anneal (RTA) process performed at a temperature ranging from approximately 800–1100° C. for a time ranging from approximately 5–60 seconds. The rapid thermal anneal (RTA) process may activate the implant and form a more sharply defined and less graded activated implant junction with the substrate 105 than would a rapid thermal anneal (RTA) process following an implant with a source/drain extension (SDE) dose of more mobile P (for $N^-$-doping appropriate for an NMOS transistor 1100) or B (for $P^-$-doping appropriate for a PMOS transistor 1100).

Figure 9:
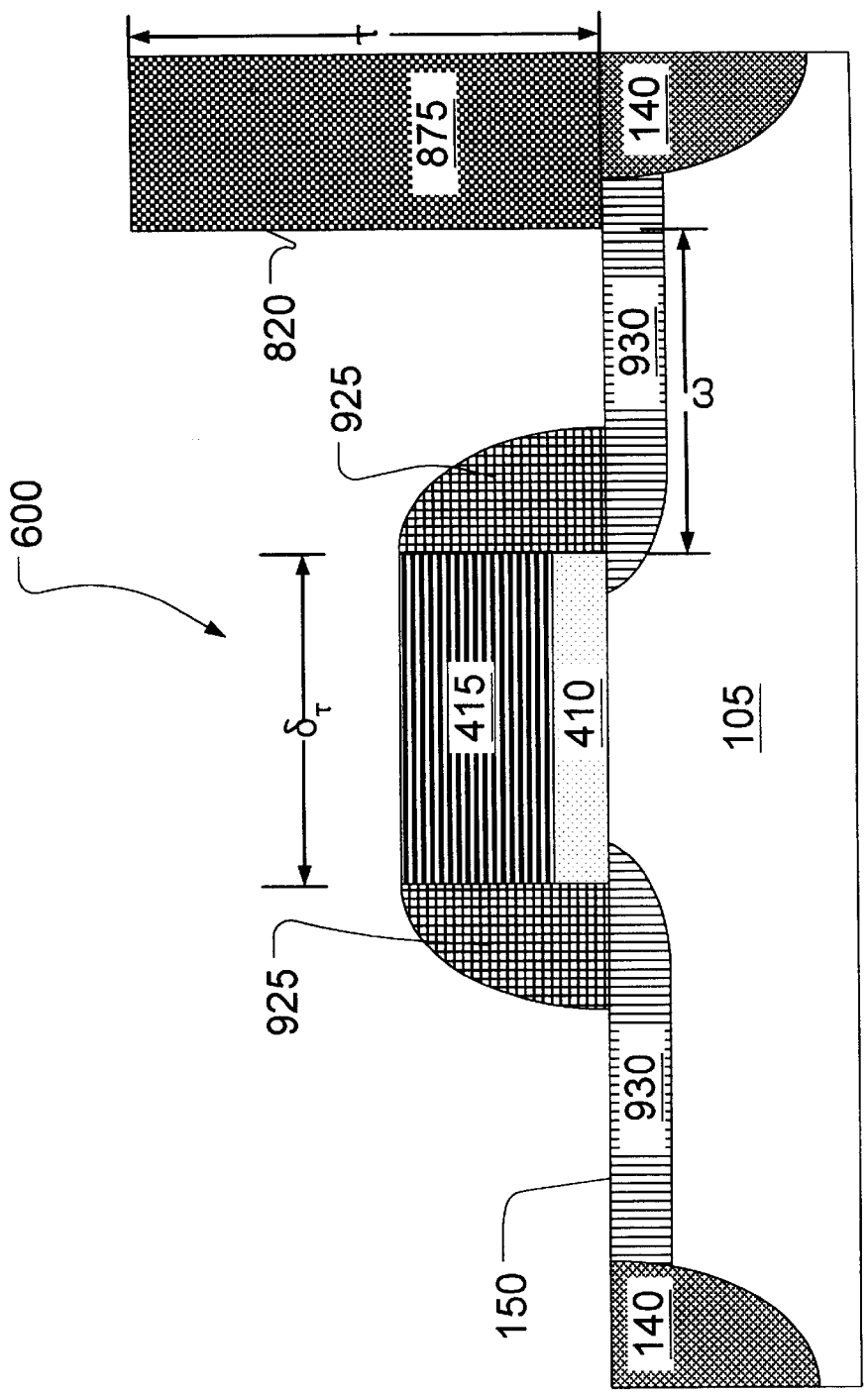

As shown in FIG. 9, dielectric spacers 925 may be formed adjacent the unmasked gate stack 600, either before or after the $N^-$-doped ($P^-$-doped) regions 830 are activated to become the $N^-$-doped ($P^-$-doped) source/drain extension (SDE) regions 930. As shown in FIG. 9, the dielectric spacers 925 may be formed by a variety of techniques above the $N^-$-doped ($P^-$-doped) source/drain extension (SDE)

regions 930 and adjacent the unmasked gate stack 600. For example, the dielectric spacers 925 may be formed by depositing a conformal layer (not shown) of the appropriate material above and adjacent the unmasked gate stack 600, and then performing an anisotropic reactive ion etching (RIE) process on the conformally blanket-deposited layer. The dielectric spacers 925 may each have a base thickness ranging from approximately 300–1500 Å, for example, measured from the edges 450 of the unmasked gate stack 600.

The dielectric spacers 925, like the gate dielectric 410, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The dielectric spacers 925 may also be formed of any suitable "low dielectric constant" or "low K" material, where K is less than or equal to about 4. Examples include Applied Material's Black Diamond®, Novellus' Coral®, Allied Signal's Nanoglass®, JSR's LKD5104, and the like. Additionally, the dielectric spacers 925 may be comprised of a fluorine-doped oxide, a fluorine-doped nitride, a fluorine-doped oxynitride, a fluorine-doped low K material, and the like. In one illustrative embodiment, the dielectric spacers 925 are comprised of $SiO_2$, having a base thickness of approximately 300 Å.

Figure 10:
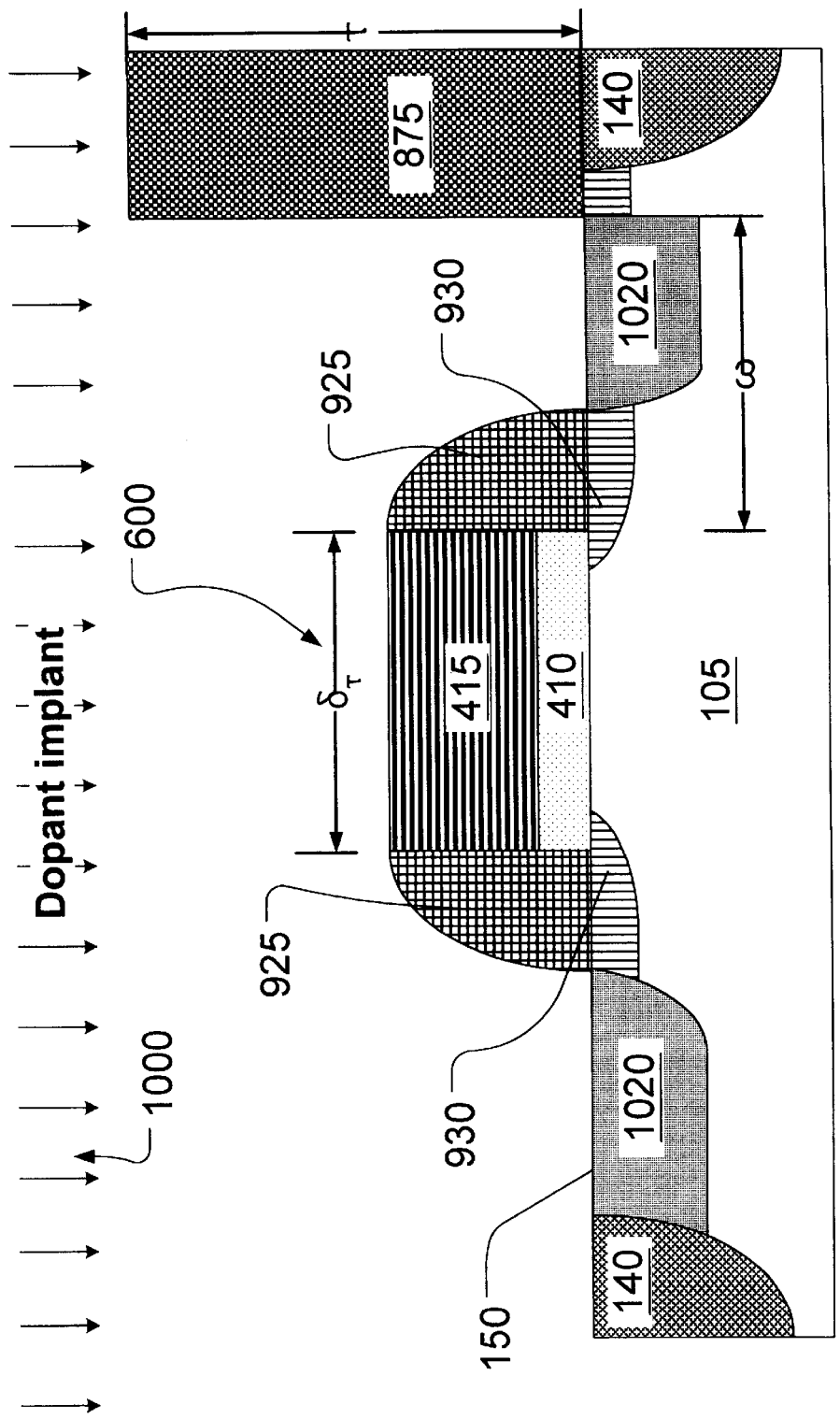

As shown in FIGS. 10–11, a dopant 1000 (indicated by arrows) may be implanted to introduce dopant atoms and/or molecules into the semiconducting substrate 105 to form $N^+$-doped ($P^+$-doped) regions 1020. After activation, the $N^+$-doped ($P^+$-doped) regions 1020 become $N^+$-doped ($P^+$-doped) source/drain regions 1120 (FIG. 11). In one illustrative embodiment, a dose of the dopant 1000 atoms and/or molecules may range from approximately $1.0 \times 10^{15} - 5.0 \times 10^{15}$ ions/cm$^2$ of the appropriate dopant 1000 atoms and/or molecules, e.g., P for an illustrative NMOS transistor or B for an illustrative PMOS transistor. An implant energy of the dopant 1000 atoms and/or molecules may range from approximately 30–100 keV. In another illustrative embodiment, a dose of the dopant 1000 atoms is approximately $1.0 \times 10^{15}$ ions/cm$^2$ of P for an NMOS transistor or B for a PMOS transistor at an implant energy of approximately 30 keV.

The dopant 1000 may be an $N^+$ implant such as P, As, antimony (Sb), bismuth (Bi), and the like, and may form heavily doped $N^+$ source/drain regions 1120. An $N^+$ implant would be appropriate for the fabrication of an NMOS transistor 1100, for example. Alternatively, the dopant 1000 may be a $P^+$ implant such as B, boron fluoride (BF, $BF_2$), aluminum (Al), gallium (Ga), Indium (In), Thallium (Tl), and the like, and may form heavily doped $P^+$ source/drain regions 1120. A $P^+$ implant would be appropriate for the fabrication of a PMOS transistor 1100, for example.

As shown in FIGS. 10–11, the $N^+$-doped ($P^+$-doped) regions 1020 may be subjected to a rapid thermal anneal (RTA) process performed at a temperature ranging from approximately 800–1100° C. for a time ranging from approximately 5–60 seconds to form the $N^+$-doped ($P^+$-doped) source/drain regions 1120. The rapid thermal anneal (RTA) process may activate the implant of the more mobile P (for $N^+$-doping appropriate for an NMOS transistor 1100) or B (for $P^+$-doping appropriate for a PMOS transistor 1100) and form a less sharply defined and more graded activated implant junction with the structure 105 than would a rapid thermal anneal (RTA) process following an implant with a source/drain dose of less mobile As (for $N^+$-doping appropriate for an NMOS transistor 1100) or $BF_2$ (for $P^+$-doping appropriate for a PMOS transistor 1100).

Alternatively, a rapid thermal anneal (RTA) process to diffuse and activate the $N^+$-doped ($P^+$-doped) regions 1020 to form the $N^+$-doped ($P^+$-doped) source/drain regions 1120 may be performed in conjunction with a self-aligned silicidation (salicidation) process (not shown), either prior to, during or following the salicidation. Such a salicidation-conjoined rapid thermal anneal (RTA) process may be performed at a temperature ranging from approximately 800–1000° C. for a time ranging from approximately 10–60 seconds.

Any of the above-disclosed embodiments of a method of manufacturing semiconductor devices with reduced critical dimensions enables the formation and patterning of components such as gate conductors and gate dielectrics on much reduced scales, consistently, robustly and reproducibly, and in a self-aligned manner. Any of the above-disclosed embodiments of a method of manufacturing semiconductor devices with reduced critical dimensions enables the achievement of reduced critical dimensions using deep ultraviolet (DUV) photolithography without problems associated with "footing" or neutralization of the Photo Acid Generator (PAG) in deep ultraviolet (DUV) photoresists at the interface between the inorganic bottom anti-reflective coating (BARC) and an overlying deep ultraviolet (DUV) photoresist layer. By avoiding problems associated with footing, any of the above-disclosed embodiments of a method of manufacturing semiconductor devices may decrease the number of deep ultraviolet (DUV) photolithography reworks, decreasing manufacturing costs and increasing throughput, more effectively and more stably than with conventional techniques.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   forming a gate dielectric layer above a substrate layer;
   forming a gate conductor layer above the gate dielectric layer;
   forming an inorganic bottom anti-reflective coating layer above the gate conductor layer;
   treating the inorganic bottom anti-reflective coating layer with an oxidizing treatment during a rapid thermal anneal process; and
   forming a deep ultraviolet photoresist layer above the treated inorganic bottom anti-reflective coating layer.

2. The method of claim 1, wherein forming the gate dielectric layer includes forming the gate dielectric layer of at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate.

3. The method of claim 1, wherein forming the gate dielectric layer includes forming the gate dielectric layer using at least one of chemical vapor deposition (CVD), low-pressure CVD (LPCVD), plasma-enhanced CVD (PECVD), sputtering, physical vapor deposition (PVD), and thermal growing.

4. The method of claim 1, wherein forming the gate dielectric layer includes forming the gate dielectric layer to have an equivalent oxide thickness $t_{ox-eq}$ ranging up to approximately 50 Å.

5. The method of claim 1, wherein forming the gate conductor layer includes forming the gate conductor layer out of one of doped-poly, aluminum (Al), titanium (Ti), zirconium (Zr), tungsten (W), tantalum (Ta), nickel (Ni), molybdenum (Mo), and cobalt (Co).

6. The method of claim 1, wherein forming the gate conductor layer includes forming the gate conductor layer using at least one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

7. The method of claim 1, wherein forming the gate conductor layer includes forming the gate conductor layer to have a thickness ranging from approximately 500–5000 Å.

8. The method of claim 1, wherein treating the inorganic bottom anti-reflective coating layer with the oxidizing treatment during the rapid thermal anneal process includes treating the inorganic bottom anti-reflective coating layer by flowing an oxidizing gas during the rapid thermal anneal process.

9. The method of claim 8, wherein flowing the oxidizing gas during the rapid thermal anneal process includes flowing oxygen gas during the rapid thermal anneal process.

10. The method of claim 1, wherein treating the inorganic bottom anti-reflective coating layer with the oxidizing treatment during the rapid thermal anneal process includes performing the rapid thermal anneal process at a temperature ranging from about 800–1100° C. for a time ranging from about 5–60 seconds.

* * * * *